United States Patent
Rimbert-Riviere et al.

(10) Patent No.: US 12,205,826 B2
(45) Date of Patent: Jan. 21, 2025

(54) METHOD FOR FORMING A SEMICONDUCTOR SUBSTRATE ARRANGEMENT

(71) Applicant: Infineon Technologies AG, Neubiberg (DE)

(72) Inventors: Charles Rimbert-Riviere, Soest (DE); Martin Goldammer, Soest (DE); Lydia Lottspeich, Warstein (DE); Ulrich Wilke, Soest (DE)

(73) Assignee: Infineon Technologies AG, Neubiberg (DE)

(*) Notice: Subject to any disclaimer, the term of this patent is extended or adjusted under 35 U.S.C. 154(b) by 795 days.

(21) Appl. No.: 17/202,849

(22) Filed: Mar. 16, 2021

(65) Prior Publication Data
US 2021/0305062 A1    Sep. 30, 2021

(30) Foreign Application Priority Data
Mar. 24, 2020    (EP) .................................... 20165192

(51) Int. Cl.
*H01L 21/48* (2006.01)
*H01L 23/00* (2006.01)
*H01L 23/498* (2006.01)

(52) U.S. Cl.
CPC .... *H01L 21/4846* (2013.01); *H01L 23/49838* (2013.01); *H01L 24/32* (2013.01); *H01L 2224/32227* (2013.01)

(58) Field of Classification Search
None
See application file for complete search history.

(56) References Cited

U.S. PATENT DOCUMENTS

| 2018/0096919 A1* | 4/2018 | Roth ............... H01L 24/97 |
| 2019/0096817 A1* | 3/2019 | Yu ............... H01L 23/3128 |

FOREIGN PATENT DOCUMENTS

| DE | 4004844 C1 | 1/1991 |
| EP | 3518278 A1 | 7/2019 |
| EP | 3627546 A1 | 3/2020 |
| EP | 3644358 A1 | 4/2020 |

* cited by examiner

*Primary Examiner* — Stephanie P Duclair
(74) *Attorney, Agent, or Firm* — Murphy, Bilak & Homiller, PLLC

(57) ABSTRACT

A method for forming a semiconductor substrate arrangement includes: forming a mask on a semiconductor substrate, the semiconductor substrate including and a metallization layer arranged on an insulation layer, the metallization layer arranged between the mask and insulation layer; forming a layer of electrically conductive coating on the metallization layer, the electrically conductive coating formed in at least one opening of the mask on regions of the metallization layer that are not covered by the mask; and after forming the electrically conductive coating, removing the mask. Forming the mask includes either applying an even layer of material on the metallization layer, or applying the material of the mask on the metallization layer such that the thickness of the mask in a region adjacent to edges of the mask is greater than the thickness of the regions of the mask further away from the edges.

14 Claims, 3 Drawing Sheets

METHOD FOR FORMING A SEMICONDUCTOR SUBSTRATE ARRANGEMENT

TECHNICAL FIELD

The instant disclosure relates to a semiconductor substrate arrangement, in particular to a semiconductor substrate arrangement with a metallic layer arranged thereon.

BACKGROUND

Power semiconductor module arrangements often include at least one semiconductor substrate arranged in a housing. A semiconductor arrangement including a plurality of semiconductor bodies (e.g., two IGBTs in a half-bridge configuration) is arranged on each of the at least one substrates. Each substrate usually comprises a substrate layer (e.g., a ceramic layer), a first metallization layer deposited on a first side of the substrate layer and a second metallization layer deposited on a second side of the substrate layer. The semiconductor bodies are mounted, for example, on the first metallization layer. The second metallization layer may optionally be attached to a base plate. The controllable semiconductor devices are usually mounted to the semiconductor substrate by soldering or sintering techniques. A metallic layer may be arranged between a semiconductor body and the first metallization layer, for example, the metallic layer forming a connection layer which mechanically and electrically couples the semiconductor body to the semiconductor substrate. Usually, a thin metallic coating is arranged between such a metallic connection layer and the first metallization layer. When forming the metallic coating on the semiconductor substrate, usually unwanted cavities occur in the first metallization layer in direct proximity to the metallic coating. Contaminants may remain in the unwanted cavities after the process of forming the metallic coating has been completed. These contaminants may be set free during a following sintering process during which the semiconductor bodies are mounted on the substrate as well as during subsequent process steps such as cleaning steps, for example, and may cause unwanted oxidation of the metallization layers of the semiconductor substrate at the end of line. This may result in a loss of yield.

There is a need for a semiconductor substrate wherein the loss of yield at the end of line is reduced.

SUMMARY

A semiconductor substrate arrangement includes a semiconductor substrate including a dielectric insulation layer and a first metallization layer attached to the dielectric insulation layer, wherein the first metallization layer is arranged on the dielectric insulation layer in a vertical direction. The semiconductor substrate arrangement further includes an electrically conductive coating arranged on the first metallization layer in the vertical direction such that the first metallization layer is arranged between the electrically conductive coating and the dielectric insulation layer. In in a horizontal plane within a first distance from the outer perimeter of the electrically conductive coating, the first metallization layer does not include any cavities or trenches, or only cavities or trenches having a maximum width in a horizontal direction that is less than 10 µm and a maximum depth in the vertical direction that is less than 3 µm.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". A semiconductor body as described herein may be made from (doped) semiconductor material and may be a semiconductor chip or be included in a semiconductor chip. A semiconductor body has electrical connecting pads and includes electrodes.

Figure 1:
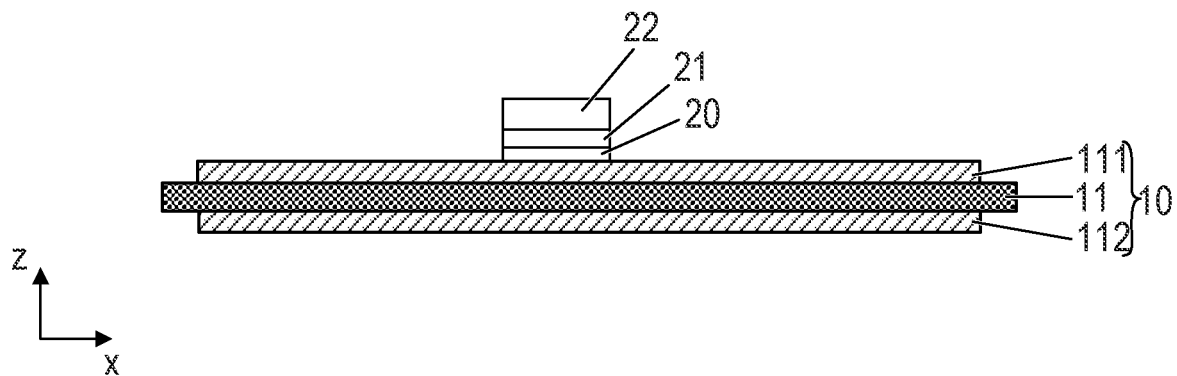
FIG. 1 is a cross-sectional view of a semiconductor substrate arrangement.

Referring to FIG. 1, a cross-sectional view of a semiconductor substrate arrangement is schematically illustrated. The semiconductor substrate arrangement includes a semiconductor substrate 10. The semiconductor substrate 10 includes a dielectric insulation layer 11, a first metallization layer 111 attached to the dielectric insulation layer 11, and a second metallization layer 112 attached to the dielectric insulation layer 11. The dielectric insulation layer 11 is disposed between the first and the second metallization layer 111, 112. It is, however, also possible that the semiconductor substrate 10 only comprises a first metallization layer 111, while the second metallization layer 112 is omitted.

Each of the first and second metallization layers 111, 112 may consist of or include one of the following materials: copper; a copper alloy; aluminum; an aluminum alloy; any other metal or alloy that remains solid during the operation of the semiconductor substrate arrangement. The semiconductor substrate 10 may be a ceramic substrate, that is, a substrate in which the dielectric insulation layer 11 is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 11 may consist of or include one of the following materials: $Al_2O_3$, AlN, SiC, BeO or $Si_3N_4$. For instance, the substrate 10 may, e.g., be a Direct Copper Bonding (DCB) substrate, a Direct Aluminum Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $Si_2O$, $Al_2O_3$, AlN, or BN and may have a diameter of between about 1 µm and about 50 µm. The substrate 10 may also be a conventional printed circuit board (PCB) having a non-ceramic dielectric insulation layer 11. For instance, a non-ceramic dielectric insulation layer 11 may consist of or include a cured resin.

Generally, one or more semiconductor bodies 22 may be arranged on the semiconductor substrate 10. Each of the semiconductor bodies arranged on the semiconductor substrate 10 may include an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), and/or any other suitable semiconductor element. The one or more semiconductor bodies 22 may form a semiconductor arrangement on the semiconductor substrate 10. In the example illustrated in FIG. 1, only one semiconductor body 22 is schematically illustrated.

The first metallization layer 111 and the second metallization layer 112 of the semiconductor substrate 10 in FIG. 1 are continuous layers. It is, however, also possible that the first metallization layer 111 and/or the second metallization layer 112 are structured layers in the arrangement illustrated in FIG. 1. "Structured layer" means that the first or second metallization layer 111, 112 is not a continuous layer, but includes recesses between different sections of the layer. Different semiconductor bodies 22 may be mounted to the same or to different sections of the first metallization layer 111, for example. Different sections of the first metallization layer 111 may have no electrical connection or may be electrically connected to one or more other sections using electrical connections (not specifically illustrated) such as, e.g., bonding wires or bonding ribbons. Electrical connections may also include connection plates or conductor rails, for example, to name just a few examples.

A semiconductor body 22 may be electrically and mechanically connected to the semiconductor substrate 10 by means of an electrically conductive connection layer 21. Such an electrically conductive connection layer 21 may be a solder layer, a layer of an electrically conductive adhesive, or a layer of a sintered metal powder, e.g., a sintered silver powder, for example. Usually, an additional electrically conducting coating 20 is arranged between the first metallization layer 111 and the electrically conductive connection layer 21. The electrically conductive coating 20 is usually a layer having a thickness in a vertical direction z of several (hundred) nanometers. The electrically conductive coating 20 is usually a thin metallic layer. For example, the electrically conductive coating 20 may comprise a metallic material such as silver. The electrically conductive coating 20 may also comprise other electrically conducting materials such as nickel or gold, for example. It is also possible that the electrically conductive coating 20 comprises a combination of two or more of silver, nickel, and gold. After applying the electrically conductive coating 20, an exchange of ions occurs between the first metallization layer 111 and the electrically conductive coating 20. If, for example, the first metallization layer 111 is a copper layer and the electrically conductive coating 20 is a thin silver layer, copper atoms may diffuse into the electrically conductive coating 20 and silver ions may diffuse into the first metallization layer 111. This results in a blurred boundary between the metallization layer 111 and the electrically conductive coating 20. That is, there is no longer a sharp boundary between the first metallization layer 111 and the electrically conductive coating 20. A transition zone is formed which contains ions of both materials.

Once the electrically conductive coating 20 has been formed, an electrically conductive connection layer 21 may be formed on the electrically conductive coating 20 such that the electrically conductive coating 20 is arranged between the electrically conductive connection layer 21 and the first metallization layer 111. The electrically conductive connection layer 21 usually has a greater thickness in the vertical direction z than the electrically conductive coating 20. In a further step, a semiconductor body 22 may be arranged on the electrically conductive connection layer 21 and, e.g., a sintering process may be performed in order to mechanically and electrically couple the semiconductor body 22 to the semiconductor substrate 10. The electrically conductive connection layer 21 then provides a permanent connection between the semiconductor body 22 and the semiconductor substrate 10.

Figure 2A:
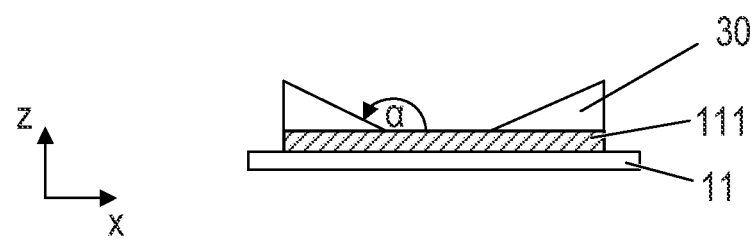
FIGS. 2A-2C schematically illustrate a conventional process for forming a semiconductor module arrangement.
Figure 2B:
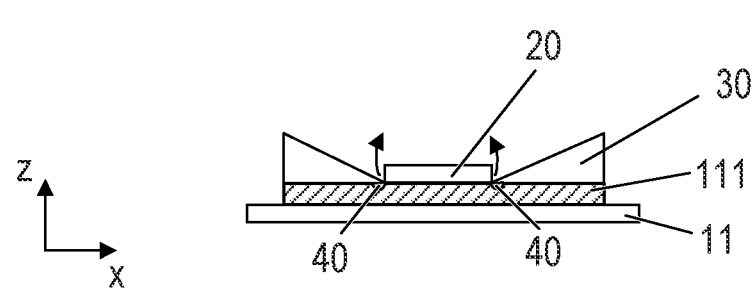
Figure 2C:
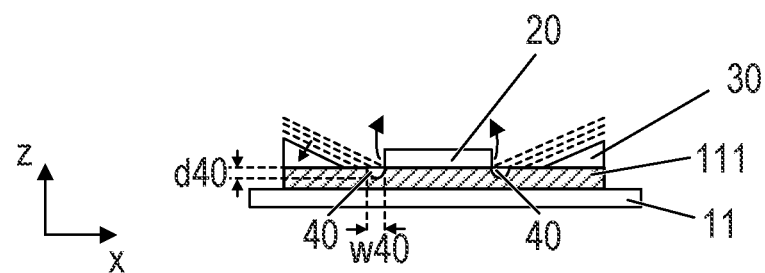

Now referring to FIGS. 2A through 2C, a conventional method for forming a semiconductor substrate arrangement comprising a semiconductor substrate 10 with an electrically conductive coating 20 arranged thereon is schematically illustrated. In a first step, the semiconductor substrate 10 is provided. The semiconductor substrate 10 comprises at least a first metallization layer 111. As has been described with respect to FIG. 1 above, this first metallization layer 111 is arranged on a dielectric insulation layer 11. A mask 30 is arranged on the first metallization layer 111. This mask 30 generally has a varying thickness in a vertical direction z. The vertical direction z is a direction perpendicular to a top surface of the semiconductor substrate 10. For example, the first metallization layer 111 is arranged on the dielectric insulation layer 11 in the vertical direction z. The mask 30 is arranged on the first metallization layer 111 such that the first metallization layer 111 is arranged between the mask 30 and the dielectric insulation layer 11. The mask 30 has at least one opening. That is, not all of the first metallization layer 111 is covered by the mask 30. The opening has a cross-section that corresponds to the cross-section of the electrically conductive coating 20 that is to be formed on the semiconductor substrate 10. The cross-section may be a square cross-section or a rectangular cross-section, for example (cross-section not visible in the cross-sectional views of FIGS. 2A through 2C.

If more than one electrically conductive coating 20 is to be formed on the semiconductor substrate 10, the mask 30 comprises more than one opening. The number of openings in the mask 30 corresponds to the number of electrically conductive coatings 20 that are to be formed on the semiconductor substrate 10.

The mask 30 covers all parts of the semiconductor substrate 10 that are not to be covered by the electrically conductive coating 20. As has been stated above, when applying the mask 30 to the semiconductor substrate 10, the thickness of the mask 30 in the vertical direction z is generally not homogenous. Usually, a thickness of the mask 30 adjacent to an opening is less than a thickness of the mask 30 further away from the opening. That is, a resulting angle α between the top surface of the semiconductor substrate 10 and the edge of the mask 30 is between 130 and 170°, for example. This often results in the formation of unwanted cavities or trenches 40 in the first metallization layer 111 adjacent to the electrically conductive coating 20, as is schematically illustrated in FIG. 2B. The electrically conductive coating 20 may be applied by any suitable process such as, e.g., screen printing, plating process, or evaporation deposition. The unwanted removal of material of the first metallization layer 111 and the formation of cavities or trenches 40 during the step of applying the electrically conductive coating 20 is indicated by means of arrows in FIG. 2B.

Once the electrically conductive coating 20 has been formed on the semiconductor substrate 10, the mask 30 can be removed. This is schematically illustrated in FIG. 2C. In order to remove the mask 30, an etching process may be used, for example. The reduction of the thickness of the mask 30 in the vertical direction z is indicated by the dashed lines in FIG. 2C. As the mask 30 has a varying thickness, the thickness in some parts (e.g., adjacent to the electrically conductive coating 20) is reduced to zero earlier than in other parts. The chemicals that are used to remove the mask 30, therefore, may etch into the first metallization layer 111 in those parts where the mask 30 has been removed earlier. This may result in the enlargement of already existing cavities or trenches 40 as well as in the formation of new cavities or trenches 40. Once the mask 30 has been fully removed from the semiconductor substrate 10, the cavities or trenches 40, therefore, often have a maximum width w40 in a horizontal direction that is greater than 10 µm, and a maximum depth d40 in the vertical direction z that is larger than 3 µm. The cavities or trenches 40 are usually arranged within a distance of 2 mm from the electrically conductive coating 20.

Different kinds of contaminants may remain in the cavities or trenches 40 after the mask 30 has been removed. For example, residues of chemicals that are used to remove the mask 30 may remain in the cavities or trenches 40, such as alkali ions or other etching material, for example. When a semiconductor body 22 is subsequently mounted to the semiconductor substrate 10, with the electrically conductive coating 20 and an electrically conductive connection layer 21 arranged between the semiconductor body 22 and the semiconductor substrate 10, the contaminants may react with materials of the different components of a semiconductor substrate 10, e.g., with the material of the electrically conductive coating 20. This may lead to an unwanted fast oxidation of the first metallization layer 111, for example, which may drastically reduce the lifetime of the semiconductor substrate arrangement.

Figure 3A:
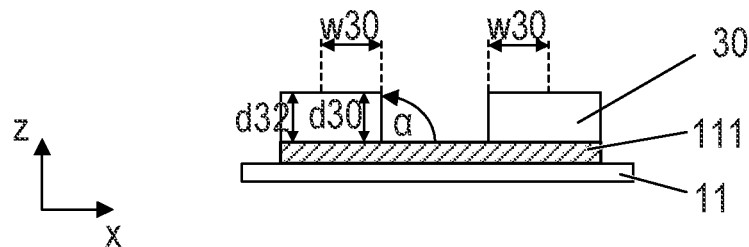
FIGS. 3A-3D schematically illustrate an exemplary method for forming a semiconductor substrate arrangement.
Figure 3B:
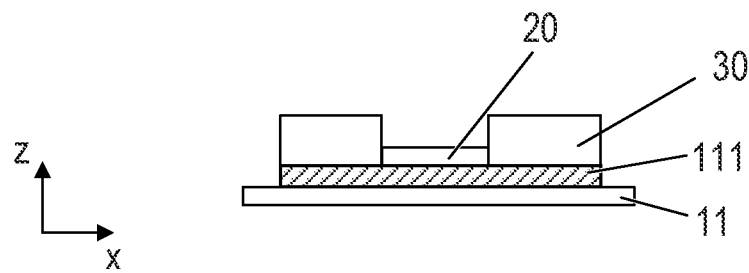
Figure 3C:
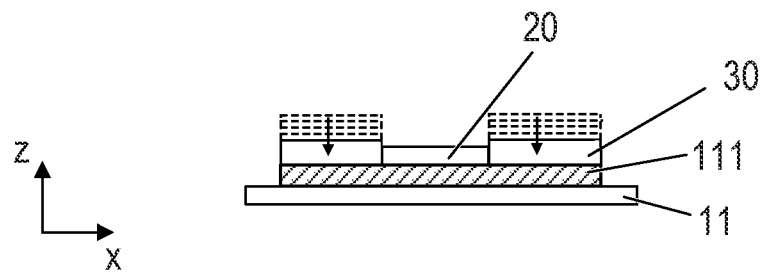

In order to reduce or even prevent the formation of unwanted cavities or trenches 40, the mask 30 is applied to the semiconductor substrate 10 evenly. According to another example, the thickness of the mask close to its edges is even greater than its thickness further away from the edges. A mask 30 having an even thickness is schematically illustrated in FIG. 3A. That is, the mask 30 has an essentially even thickness in the vertical direction z. In particular, a thickness d30 of the mask 30 close to its edges may be the same as the thickness d32 of the mask 30 in regions further away from its edges. According to another example, the thickness d30 of the mask 30 close to its edges may be even greater than the thickness d32 of the mask 30 in regions further away from its edges. An edge region of the mask 30 may be a region that is arranged within, e.g., 2 mm or 4 mm from an edge of the mask 30. That is, a width w30 of an edge region in a horizontal direction (e.g., first horizontal direction x) may be at least 2 mm or at least 4 mm. The resulting angle α between the top surface of the semiconductor substrate 10 and the edge of the mask 30 may be between 90 and 130°, for example. The following steps of forming the electrically conductive coating 20 and removing the mask 30 in FIGS. 3B and 3C are similar to what has been described with respect to FIGS. 2B and 2C above. The resulting electrically conductive coating 20 may have a thickness d1 of at least 300 to 1000 nm in the vertical direction z. As the thickness d30, d32 of the mask 30 is even, the mask 30 is removed evenly during the stripping process. Therefore, no cavities or trenches are formed adjacent to the electrically conductive coating 20. The same applies for cases where d30>d32. In those cases also cavities or trenches are formed adjacent to the electrically conductive coating 20.

Figure 3D:
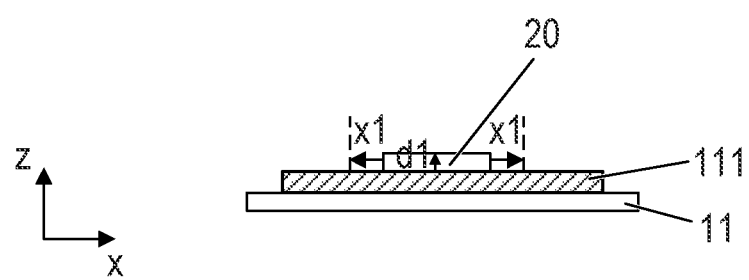

The resulting semiconductor substrate arrangement is schematically illustrated in FIG. 3D. As can be seen, there are no cavities or trenches within a first distance x1 from the outer perimeter of the electrically conductive coating 20. The first distance x1 may be 2 mm, for example. Due to process irregularities or anomalies, however, small cavities or trenches 40 may be formed within the first distance x1 nevertheless (not specifically illustrated in FIG. 3D). Such small trenches or cavities 40, however, are much smaller than the cavities or trenches 40 that have been described with respect to FIGS. 2A through 2C above. In particular, any cavities or trenches 40 within the first distance x1 from the outer perimeter of the electrically conductive coating 20 have a maximum width w40 in a horizontal direction x, y or horizontal plane that is less than 10 µm and a maximum depth d40 in the vertical direction z that is less than 3 µm. Such small cavities or trenches 40 may store less or even no contaminants Therefore, the risk of a fast oxidation during later processes is greatly reduced.

Figures 4A, 4B:
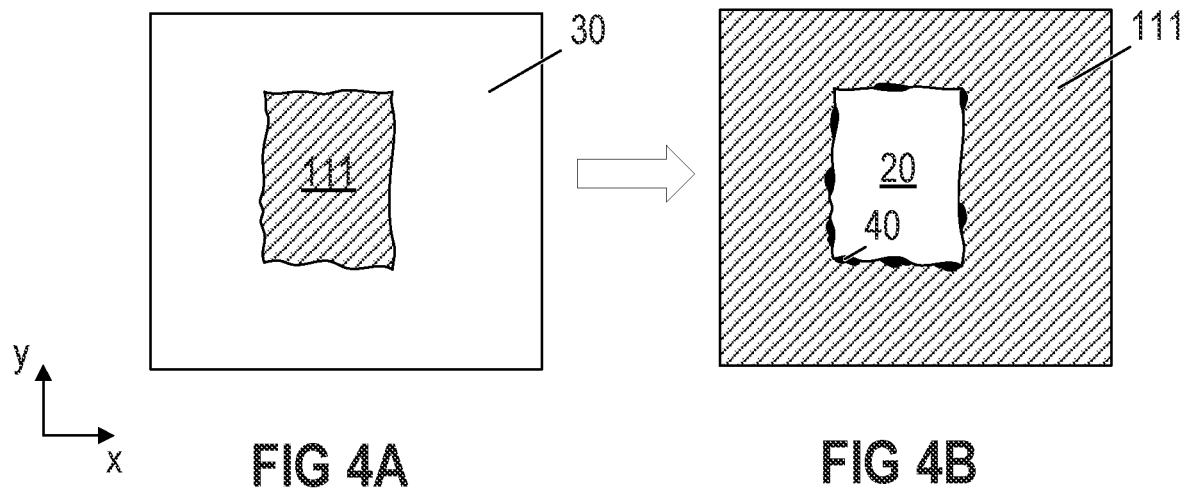
FIGS. 4A and 4B illustrate top views of a semiconductor substrate arrangement before and after forming a metallic coating when using a conventional plating process.

Problems may also arise if the outer edge of the mask 30 is not formed evenly. This is exemplarily illustrated in the top view of FIGS. 4A and 4B. In FIG. 4A, a mask 30 is schematically illustrated that is arranged on a semiconductor substrate 10, in particular on a first metallization layer 111. Through an opening in the mask 30, the first metallization layer 111 is visible. The edge of the mask 30, however, is uneven. That is, the edges of the mask do not form straight lines. This also results in unwanted cavities or trenches 40 when forming the electrically conductive coating 20 and removing the mask 30. FIG. 4B illustrates the final state of the semiconductor substrate arrangement. The electrically conductive coating 20 is arranged on the semiconductor substrate 10 and the mask 30 has been removed from the semiconductor substrate 10. That is, those regions of the first metallization layer 111 that were covered by the mask 30 in FIG. 4A are visible in the final state in FIG. 4B, similar to the arrangements of FIGS. 3A and 3D. A plurality of cavities or trenches 40 is present in the first metallization layer 111.

Figures 5A, 5B:
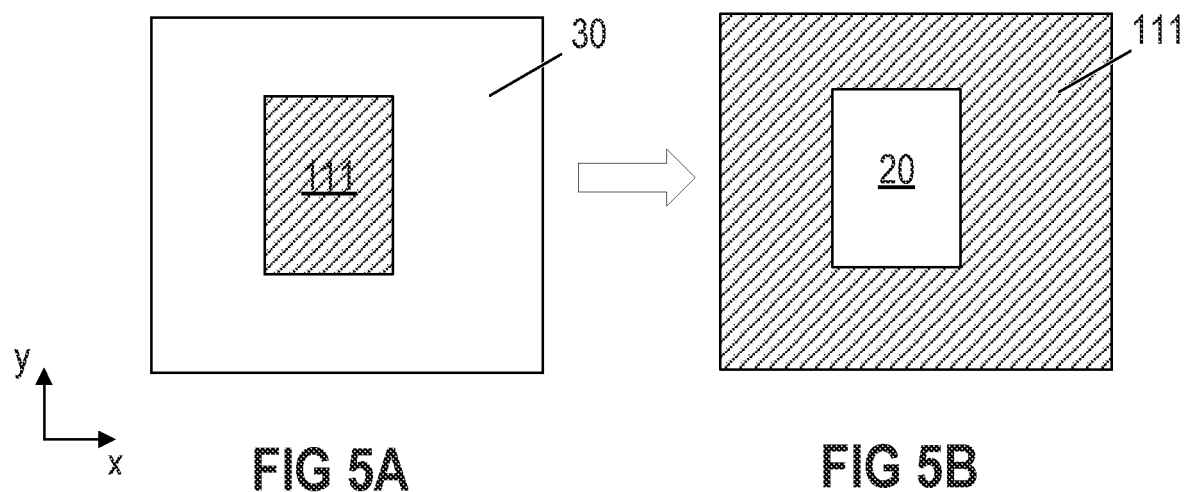
FIGS. 5A and 5B illustrate top views of a semiconductor substrate arrangement before and after forming a metallic coating when using an exemplary plating process.

On the other hand, if the edge of the mask 30 is formed evenly, as is schematically illustrated in FIG. 5A, no cavities or trenches 40 or only small cavities or trenches 40 are formed in the first metallization layer 111, as is illustrated in FIG. 5B. Small cavities or trenches 40 again refers to cavities or trenches 40 within the first distance x1 from the outer perimeter of the electrically conductive coating 20 that have a maximum width w40 in a horizontal direction x, y or horizontal plane that is less than 10 µm and a maximum depth d40 in the vertical direction z that is less than 3 µm. If the edge of the mask 30 is formed evenly, potential underetching of the mask 30 may be prevented. If such underetching occurs, e.g., in the example of FIGS. 4A and 4B, the first metallization layer 111 may be corrupted in the regions of the underetching which results in unwanted cavities and trenches 40.

The mask 30 may be formed with an even thickness if a viscosity of the material forming the mask while applying the mask 30 to the semiconductor substrate 10 is chosen to be high enough to prevent unwanted smudging or smearing of the material. The viscosity depends on the material of the mask 30 and the temperature of the material while applying it to the semiconductor substrate 10. After applying the material to the semiconductor substrate 10, it may be hardened to a certain degree by removing at least part of the liquid, for the mask 30 to remain solid while forming the electrically conductive coating 20. The material of the mask 30 may also be chosen to have improved adhesion properties, in order to prevent unwanted lift off of the mask 30 during the process of forming the electrically conductive coating 20. Even further, the material of the mask 30 may be chosen to have improved properties concerning the strip off process of the mask 30 (removal of the mask). That is, the mask may be easy to remove. Event further, the process parameters of the process of forming the mask 30 may be improved in order to guarantee an even thickness and even edges of the mask 30. That is, process parameters such as a process temperature may be optimized with regard to the material that is used to form the mask 30.

A method for forming a semiconductor substrate arrangement may comprise forming a mask 30 on a semiconductor substrate 10, the semiconductor substrate 10 comprising a dielectric insulation layer 11, and a first metallization layer 111 arranged on the dielectric insulation layer 11. The mask 30 comprises at least one opening. That is, forming the mask 30 comprises forming the mask 30 only on some regions of the first metallization layer 111, while at least one region of the first metallization layer 111 remains free of the mask 30. The first metallization layer 111 is arranged between the mask 30 and the dielectric insulation layer. Forming the mask 30 comprises applying an essentially even layer of material on the first metallization layer 111. Alternatively, the material of the mask 30 may be applied to the first metallization layer 111 such that a thickness d30 adjacent to the edges of the mask 30 is greater than a thickness d32 of the mask 30 further away from the edges. Optionally, the material may then be hardened in a subsequent step (e.g., removal of liquid from the material by performing a drying or heating process). At least one electrically conductive coating 20 is then formed on the first metallization layer 111. The at least one electrically conductive coating 20 is formed on those regions of the first metallization layer 111 that are not covered by the mask 30. Once the at least one electrically conductive coating 20 has been formed, the mask 30 is removed from the semiconductor substrate 10 in a subsequent step. This results in a semiconductor substrate arrangement comprising a semiconductor substrate 10 comprising a dielectric insulation layer 11 and a first metallization layer 111 attached to the dielectric insulation layer 11, wherein the first metallization layer 111 is arranged on the dielectric insulation layer 11 in a vertical direction z. The resulting semiconductor substrate arrangement further comprises an electrically conductive coating 20 arranged on the first metallization layer 111 in the vertical direction z such that the first metallization layer 111 is arranged between the electrically conductive coating 20 and the dielectric insulation layer 11. In a horizontal plane x-y within a distance of 2 mm from the outer perimeter of the electrically conductive coating 20, the first metallization layer 111 does not comprise any cavities or trenches 40, or only cavities or trenches 40 having a width w40 in a horizontal direction x, y that is less than 10 μm and a depth d40 in the vertical direction z that is less than 3 μm.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for forming a semiconductor substrate arrangement, the method comprising:
    forming a mask on a semiconductor substrate, the semiconductor substrate comprising a dielectric insulation layer and a first metallization layer arranged on the dielectric insulation layer, the mask comprising at least one opening, wherein the first metallization layer is arranged between the mask and the dielectric insulation layer;
    forming a layer of electrically conductive coating on the first metallization layer, wherein the layer of electrically conductive coating is formed in the at least one opening on regions of the first metallization layer that are not covered by the mask; and
    after forming the layer of electrically conductive coating, removing the mask from the semiconductor substrate,
    wherein forming the mask comprises either applying an even layer of material on the first metallization layer such that a thickness of the mask in a vertical direction in a region adjacent to inner edges of the mask equals a thickness in the vertical direction of regions of the mask further away from the inner edges, or applying the material of the mask on the first metallization layer such that the thickness of the mask in the vertical direction in the region adjacent to the inner edges of the mask is greater than the thickness in the vertical direction of the regions of the mask further away from the inner edges, the vertical direction being perpendicular to a top surface of the semiconductor substrate,
    wherein the inner edges of the mask are adjacent to the electrically conductive coating,
    wherein the region adjacent to the inner edges of the mask is a region of the mask having a width in a horizontal direction of at least 2 mm that is arranged from an inner edge of the mask.

2. The method of claim 1, further comprising hardening the material of the mask before forming the layer of electrically conductive coating.

3. The method of claim 2, wherein hardening the material of the mask comprises removal of liquid from the material by performing a drying or a heating process.

4. The method of claim 1, wherein the mask is formed such that an angle between the top surface of the semiconductor substrate and the inner edge of the mask is between 9° and 130°.

5. The method of claim 1, wherein the electrically conductive coating is formed having a thickness of at least 300 to 1000 nm in the vertical direction.

6. The method of claim 1, wherein removing the mask comprises an etching process.

7. The method of claim 1, wherein the semiconductor substrate is selected from the group consisting of a Direct Copper Bonding (DCB) substrate, a Direct Aluminum Bonding (DAB) substrate, and an Active Metal Brazing (AMB) substrate.

8. The method of claim 7, wherein the dielectric insulation layer is a ceramic material comprising one or more dielectric ceramic materials.

9. The method of claim 1, wherein the semiconductor substrate is an Insulated Metal Substrate (IMS).

10. The method of claim 9, wherein the dielectric insulation layer is a composite material comprising one or more polymers and one or more dielectric ceramic materials.

11. The method of claim 1, wherein the semiconductor substrate is a printed circuit board and the dielectric insulation layer is a non-ceramic dielectric material.

12. The method of claim 1, further comprising:
forming an electrically conductive connection layer on the electrically conductive coating,
wherein the electrically conductive coating is arranged between the electrically conductive connection layer and the first metallization layer.

13. The method of claim 12, further comprising:
arranging one or more semiconductor bodies on the electrically conductive connection layer.

14. The method of claim 13, further comprising:
coupling the one or more semiconductor bodies to the semiconductor substrate via the electrically conductive connection layer and the electrically conductive coating.

* * * * *

UNITED STATES PATENT AND TRADEMARK OFFICE
CERTIFICATE OF CORRECTION

| | | |
|---|---|---|
| PATENT NO. | : 12,205,826 B2 | Page 1 of 1 |
| APPLICATION NO. | : 17/202849 | |
| DATED | : January 21, 2025 | |
| INVENTOR(S) | : C. Rimbert-Riviere et al. | |

It is certified that error appears in the above-identified patent and that said Letters Patent is hereby corrected as shown below:

In the Claims

Column 8, Line 57 (Claim 4, Line 4), please change "9°" to -- 90 --.

Signed and Sealed this
First Day of April, 2025

Coke Morgan Stewart
*Acting Director of the United States Patent and Trademark Office*